(12) United States Patent
Huffaker et al.

(10) Patent No.: US 7,795,609 B2
(45) Date of Patent: Sep. 14, 2010

(54) DENSELY STACKED AND STRAIN-COMPENSATED QUANTUM DOT ACTIVE REGIONS

(75) Inventors: Diana L. Huffaker, Albuquerque, NM (US); Noppadon Nuntawong, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 876 days.

(21) Appl. No.: 11/462,777

(22) Filed: Aug. 7, 2006

(65) Prior Publication Data

US 2007/0201522 A1 Aug. 30, 2007

Related U.S. Application Data

(60) Provisional application No. 60/705,494, filed on Aug. 5, 2005.

(51) Int. Cl.
*H01L 29/66* (2006.01)
(52) U.S. Cl. .............................. 257/14; 257/15; 257/17; 257/18; 257/22; 257/E29.071; 257/E29.192; 257/E29.34; 257/E33.005; 257/E33.008
(58) Field of Classification Search .................. 257/14, 257/17, 628, E21, 126; 372/45.01
See application file for complete search history.

(56) References Cited

U.S. PATENT DOCUMENTS

| | | | | |
|---|---|---|---|---|
| 5,936,258 A | * | 8/1999 | Imamura et al. | 257/21 |
| 6,573,527 B1 | * | 6/2003 | Sugiyama et al. | 257/14 |
| 6,600,169 B2 | * | 7/2003 | Stintz et al. | 257/14 |
| 6,816,525 B2 | * | 11/2004 | Stintz et al. | 372/45.01 |
| 6,858,863 B2 | * | 2/2005 | Shimizu et al. | 257/16 |
| 2001/0028055 A1 | * | 10/2001 | Fafard et al. | 257/17 |
| 2002/0114367 A1 | * | 8/2002 | Stintz et al. | 372/45 |

* cited by examiner

*Primary Examiner*—Zandra Smith
*Assistant Examiner*—Tsz K Chiu
(74) *Attorney, Agent, or Firm*—MH2 Technology Law Group LLP

(57) ABSTRACT

Embodiments provide a quantum dot active structure and a methodology for its fabrication. The quantum dot active structure includes a substrate, a plurality of alternating regions of a quantum dot active region and a strain-compensation region, and a cap layer. The strain-compensation region is formed to eliminate the compressive strain of an adjacent quantum dot active region, thus allowing quantum dot active regions to be densely-stacked. The densely-stacked quantum dot active region provides increased optical modal gain for semiconductor light emitting devices such as edge emitting lasers, vertical cavity lasers, detectors, micro-cavity emitters, optical amplifiers or modulators.

20 Claims, 2 Drawing Sheets

DENSELY STACKED AND STRAIN-COMPENSATED QUANTUM DOT ACTIVE REGIONS

RELATED APPLICATIONS

This application claims priority from U.S. Provisional Patent Application Ser. No. 60/705,494, filed Aug. 5, 2005, which is hereby incorporated by reference in its entirety.

GOVERNMENT RIGHTS

This invention was made with government support under Contract No. F49620-03-1-0433 awarded by the Air Force Office of Scientific Research. The government has certain rights in the invention.

FIELD OF THE INVENTION

This invention relates generally to quantum dot active structures used in semiconductor light emitting devices, and, more particularly, to quantum dot active structures with densely-stacked and strain-compensated quantum dot active regions.

BACKGROUND OF THE INVENTION

Quantum dots (QDs) continue to intrigue technologists with the potential benefits of zero-dimensionality, low threshold current density and temperature sensitivity in modern semiconductor laser applications. The QDs formed by strain-driven processes are especially interesting since they can be easily embedded in a solid-state region to enable current injection and electrical/optical confinement. Active devices, such as, a laser, detector, modulator, etc. can be formed with a QD active region.

Problems arise for the QD active region due to its very low modal gain at the ground state energy level. Generally, for an active device to achieve high ground state modal gain requires a QD active region having a high density of states and a large overlap with the optical mode of the active device. One conventional technique for achieving high modal gain is to use stacked QD active regions. The stacked QD active regions typically include one QD active region stacked upon another QD active region and so on. The stacked QD active regions have been shown to increase ground state modal gain, which results in low threshold ground state lasing and high characteristic temperature in comparison to quantum well active regions.

However, this conventional technique has drawbacks and disadvantages. For example, one drawback is caused by the vertically propagating strain field that originates at the first QD active region and grows with each subsequent QD active region. In fact, the strain field from the first QD active region seeds the nucleation of the following QD active region, and so on, especially for the case when the QD active regions are stacked with a QD interlayer separation of less than 40 nm. Although such strain field is the cause of the columnar growth mode characteristic for all strain-coupled QD active regions, the strain energy in the strain field eventually grows too large to be absorbed by the QD formation. The strain energy may then drive defect formation such as coalescence of QDs, thus limiting the number of stacks.

A conventional solution to reduce this effect of the vertical strain field and increase the number of QD stacks is to increase the QD interlayer separation to, for example, higher than 40 nm. In this case, the vertically propagated strain fields can be diffused. However, this solution also has drawbacks and disadvantages. For example, the large interlayer separation reduces the overlap between the stacked QD active regions and the optical mode of the active device.

Thus, there is a need to overcome these and other problems of the prior art and to provide a quantum dot active structure for providing increased overlaps between the stacked QD active regions and the optical mode of the active device thus providing increased optical modal gain.

SUMMARY OF THE INVENTION

According to various embodiments, the present teachings include a quantum dot active structure for providing modal gain comprising a substrate, a plurality of quantum dot active regions stacked over the substrate and a plurality of strain compensation regions. The strain compensation regions are interspersed with the quantum dot active regions stacked over the substrate, and a cap layer is formed over the stacked quantum dot active regions.

According to other various embodiments, the present teachings include a method for forming a quantum dot active structure comprises providing a substrate, forming a stack structure over the substrate, and forming a cap layer to cover the stack structure. The stack structure comprises a plurality of alternating regions of a quantum dot active region and a strain-compensation region.

According to still further various embodiments, the present teachings include a semiconductor laser device comprising a quantum dot active structure and a laser cavity comprising the quantum dot active structure, wherein the laser cavity is oriented.

According to yet further various embodiments, the present teachings include a semiconductor active structure for providing optical modal gain comprising a substrate comprising a GaAs buffer layer overlaying a GaAs initial substrate, a plurality of alternating regions of an InAs quantum dot active region and a GaP strain-compensation region formed as a stack structure over the substrate, and a GaAs cap layer formed over the stack structure.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention.

DESCRIPTION OF THE EMBODIMENTS

Embodiments provide a QD active structure and a methodology for forming the QD active structure with densely-stacked and strain-compensated QD active regions. More specifically, strain-compensation (SC) regions may be formed to alternate with the QD active regions to eliminate the compressive strain of each QD active region. An SC region may include an SC layer, which may be a tensile layer used for counterbalancing the strain of an adjacent QD active region. Thus, the SC layer may allow desired stacking of the QD active regions while still realizing closely spaced QD layers, and resulting in a increased modal gain for the QD active region.

Reference will now be made in detail to exemplary embodiments of the invention, an example of which is illustrated in the accompanying drawings. Wherever possible, the same reference numbers will be used throughout the drawings to refer to the same or like parts.

In the following description, reference is made to the accompanying drawings that form a part thereof and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
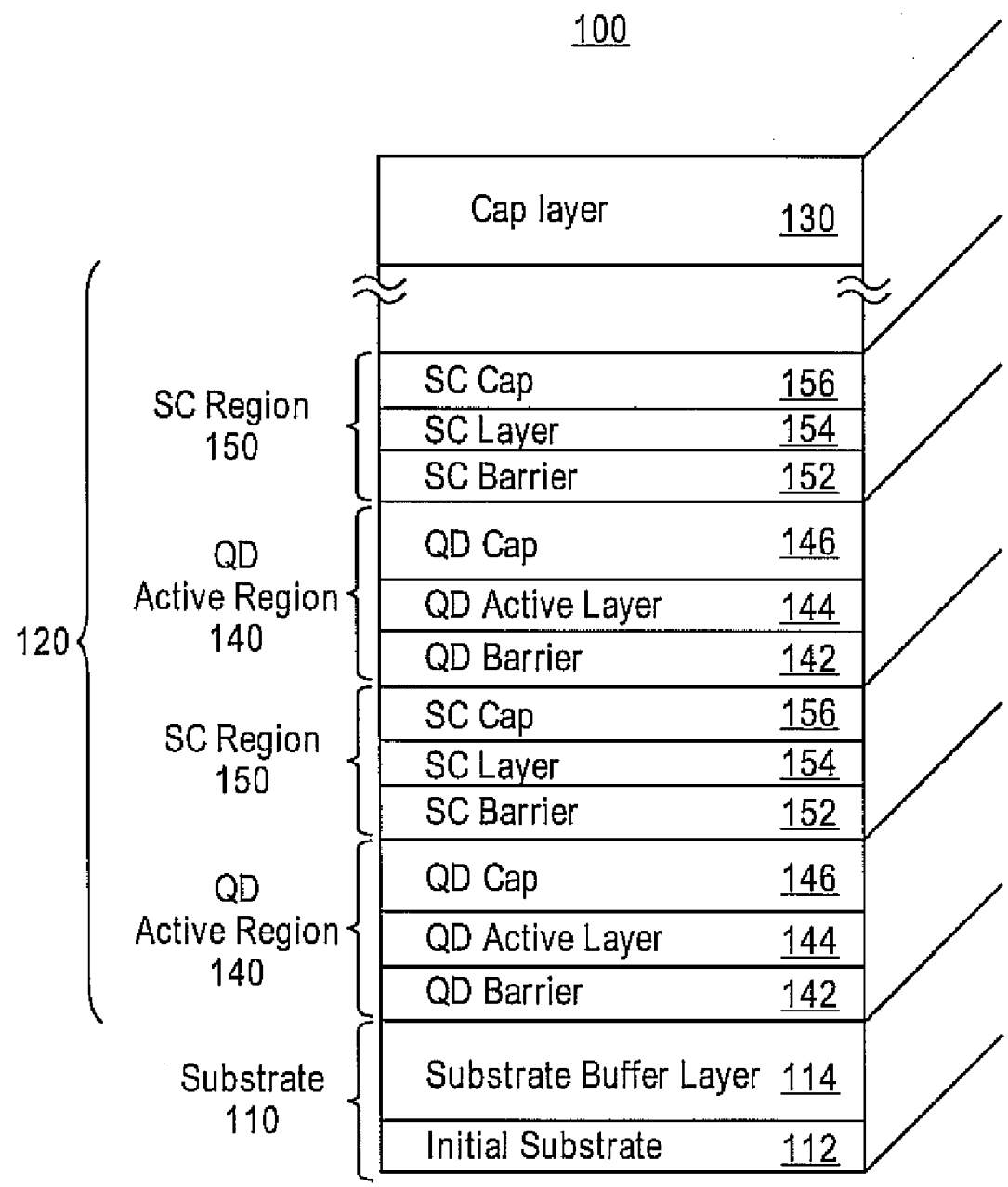
FIG. 1 is a schematic diagram of an exemplary QD active structure 100 in accordance with the present teachings.

FIG. 1 is a perspective diagram of a QD active structure 100 in accordance with various embodiments. It should be readily obvious to one of ordinary skill in the art that the structure 100 depicted in FIG. 1 represents a generalized schematic illustration and that other layers may be added or existing layers may be removed or modified.

In various embodiments, the QD active structure 100 may be formed using a variety of crystal growth techniques, such as, for example, metallo-organic chemical vapor deposition (MOCVD), molecular beam epitaxy (MBE) or gas source MBE (GSMBE).

In various embodiments, a III-V compound semiconductor materials system may be used to form the QD active structure 100. In these materials systems, examples of the group III element may include Ga, In or Al. During formation of the QD active structure 100, exemplary group III precursors, such as trimethylgallium (TMGa) or triethylgallium (TEGa), trimethylindium (TMIn) or trimethylaluminum (TMAl) may be used to provide a respective exemplary element, that is, Ga, In or Al. In the III-V materials system, examples of the group V element may include As, Sb, N, or P. During formation of the QD active structure 100, exemplary group V precursors, such as tertiarybutylphoshine (TBP), or arsine ($AsH_3$) may be used to provide respective exemplary elements such as P or As. In various embodiments, many different III-V semiconductor alloy compositions may be used, based on the known relationships between bandgap energy and lattice constant of different III-V compounds. In the following description, III-V semiconductor alloy compositions may be described by the combination of III-V elements, such as, for example, InGaAs, AlGaAs, AlGaInAs, GaNAs, InGaAsP, or GaInNAs. Generally, the elements in a composition may be combined with various molar fractions. For example, the semiconductor alloy composition InGaAs may stand for $In_{(x)}Ga_{(1-x)}As$, where the molar fraction, x, may be any number less than 1.00. In another example, the semiconductor alloy composition GaNAs may stand for $GaN_{(x)}As_{(1-x)}$, where the molar fraction, x, may be any number less than 1.00.

Returning to FIG. 1, the QD active structure 100 may include a substrate 110, a plurality of alternating regions 120, and a cap layer 130. The plurality of alternating regions 120 may be stacked over the substrate 110 and covered by the cap layer 130.

The substrate 110 may include an initial substrate 112 and a substrate buffer layer 114. The initial substrate 112 may be at least one of III-V compound semiconductor substrates such as, for example, GaAs, InP or other similar material. In various embodiments, the initial substrate 112 may be pretreated. For example, an undoped GaAs may be used as an initial substrate 112, which may be annealed to evaporate the oxide layer and most contaminations on the surface. The annealing temperature may range from about 750 to about 850 degrees Celsius. And the annealing time may range from about 4 to about 8 minutes. For example, a GaAs initial substrate 112 may be annealed at the temperature of about 760 degrees Celsius for 5 minutes.

The substrate buffer layer 114 may be formed over the initial substrate 112 to make the substrate surface flat and hinder a diffusion of possible contamination from the initial substrate 112 towards an active zone of the reactor such as in a MOCVD process. The substrate buffer layer 114 may also include at least one of III-V compound semiconductor substrates such as GaAs, InP or other similar material. For example, a GaAs may be deposited as the substrate buffer layer 114 on a GaAs initial substrate 112 at a temperature range from about 700 to about 750 degrees Celsius with a thickness ranging from about 200 to about 500 nm. More specifically, for example, the GaAs buffer layer may be grown over the GaAs initial substrate at 680 degree Celsius with a thickness of about 300 nm.

The plurality of alternating regions 120 may include an alternating QD active region 140 and an alternating SC region 150 as shown in FIG. 1. Although FIG. 1 shows the detail for the first two alternating regions, the stack number of the alternating regions 120, i.e., the stack number of the alternating QD active region 140 or the stack number of the alternating SC region 150, may be 10, 30, 50 or another as-desired number. In various embodiments, the plurality of alternating regions 120 may be stacked over the substrate 110 starting with a QD active region.

The alternating QD active region 140 may include a QD barrier layer 142, a QD active layer 144 and a QD cap layer 146. The QD active layer 144 may be sandwiched between the QD barrier layer 142 and the QD cap layer 146.

The QD barrier layer 142 may be grown over the substrate 110, more specifically, over the substrate barrier layer 114. The QD barrier layer 142 may be formed of at least one of InGaAs, AlGaAs, AlGaInAs, AlGaAsSb or other similar material. For example, an InGaAs may stand for an $In_{(x)}Ga_{(1-x)}As$, where the molar fraction, x, may be one of 0.13, 0.15, 0.33, 0.5, 0.53, 0.65, or other number less than 1.00. The QD barrier layer 142 may include a number of monolayers (MLs), such as, 5 MLs in this example. As used herein the term "monolayer" (ML) refers to a single, closely packed layer of atoms or molecules. The thickness of one monolayer may be the thickness of the single and closely packed layer of according atoms or molecules.

The QD active layer 144 may be grown over the QD barrier layer 142. The QD active layer 144 may be formed of at least one of InAs, InSb, GaSb, AlSb, AlAs, InGaAs, GaNAs, InGaAsP, GaInNAs or other similar material. The thickness of the QD active layer 144 may also include various numbers of monolayers. For example, a QD active layer 144 may be formed of InAs with 3 MLs for the alternating QD active region 140. In various embodiments, a postnucleation arsine pause may be performed to reduce the defect density and improve QD uniformity after the growth of the QD active layer 144.

The QD cap layer 146 may be grown to cover the QD active layer 144 to confine charge carriers in a vicinity of QDs and prevent charge carriers from migration. The QD cap layer 146 may be formed of at least one of InGaAs, AlGaAs, AlGaInAs or other similar materials. In various embodiments, the QD cap layer 146 may be formed using a similar material for the QD barrier layer 142. The QD cap layer 146 may also include a sufficient number of monolayers, which may provide the QD cap layer 146 with enough thickness to prevent a blue-shift of the QD emission wavelength. For example, the QD cap layer 146 may be formed of an $In_{0.15}Ga_{0.85}As$ with a thickness of 25 MLs.

In various embodiments, the QD barrier layer 142, the QD active layer 144 and the QD cap layer 146 of the alternating QD active region 140 may be grown at a temperature range from about 450 to about 520 degree Celsius. The alternating SC region 150 may include an SC barrier layer 152, an SC layer 154, and an SC cap layer 156. The SC layer 154 may be sandwiched between the SC barrier layer 152 and the cap layer 156.

The SC barrier layer 152 may be formed to introduce the SC layer 154 over the alternating QD active region 140, more particularly, over the QD cap layer 146. The SC barrier layer 152 may be formed of at least one of GaAs, InP, AlGaAs or other similar material. The SC barrier layer 152 may use a similar material as used for the substrate 110. The thickness of the SC barrier layer 152 may vary from about 1 nm to about 3 nm.

The SC layer 154 may be formed over the SC barrier layer 152. The SC layer 154 may be a tensile layer formed to counterbalance the compressive strain of the previous QD active layer. The SC layer 154 may be formed of at least one of GaP, GaNAs, InGaP, or other similar material, for example, a $GaN_{(x)}As_{(1-x)}$, where x may be 0.005, 0.15 or other number less than 1.00. The SC layer 154 may be grown with various numbers of monolayers, such as, for example, 2, 4, 6, 8 or other number of MLs.

The SC cap layer 156 may be formed to cover and initialize the surface of the SC layer 154 for the growth of another QD active region. Accordingly, the SC cap layer 156 may be formed using a similar material as used for the substrate barrier layer 114. In various embodiments, the SC cap layer 156 may also be formed using a similar material as used for the SC barrier 154. The thickness of the SC cap layer 156 may vary from about 4 nm to 30 nm.

In various embodiments, a cap layer 130 may be formed to cover the plurality of alternating regions 120 to form an end layer for the QD active structure 100. The cap layer 130 may be formed of at least one of GaAs, InGaAs, GaInAsP or other similar material. The thickness of the cap layer 130 may vary from about 800 nm to about 1000 nm. In various embodiments, the cap layer 130 may not be necessarily used.

In various embodiments, an exemplary QD active structure 100 may be formed with an InAs/GaAs system, i.e. using InAs for the QD active layer 144 and GaAs for the substrate 110. In this system, the InAs QD active layer 144, may be sandwiched between an $In_{(x)}Ga_{(1-x)}As$ QD barrier layer 142 (where x less than 1.00) and an $In_{(x)}Ga_{(1-x)}As$ QD cap layer 146 with molar fraction, x, less than 1.00. The exemplary thickness for the InGaAs QD barrier layer 142, the InAs QD active layer 144, and the InGaAs QD cap layer 146 may be 5, 3 and 25 MLs, respectively.

In this exemplary InAs/GaAs system, the SC layer 154 may be formed of GaP. The GaP SC layer 154 may be sandwiched between a GaAs SC barrier layer 152 and a GaAs SC cap layer 156. The exemplary thickness of the GaAs SC barrier layer 152, SC layer 154, and the GaAs SC cap layer 156 may be 4 nm, 4 MLs, and 4 nm, respectively. In addition, the InAs/GaAs system may be covered by a GaAs cap layer 130.

Figure 2A:
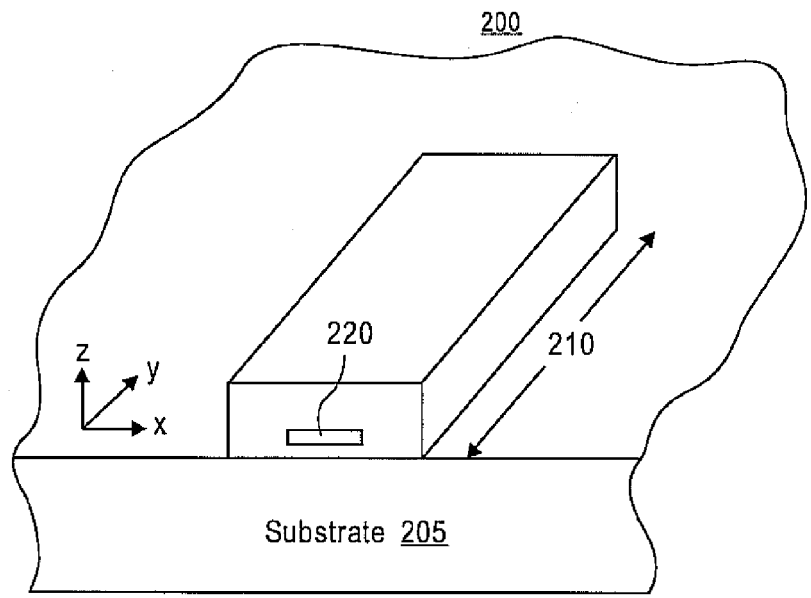
FIG. 2A is a perspective view of an exemplary semiconductor laser device including a QD active structure in accordance with the present teachings.

FIG. 2A shows an exemplary semiconductor laser device 200 including a substrate 205, a laser cavity 210 and a QD active structure 220. The laser cavity 210 may be configured over the substrate 205. The QD active structure 220 may be configured within the laser cavity 210. The substrate 205 may be any III-V compound semiconductor substrate, for example, GaAs, InP or other similar material.

The laser cavity 210 in FIG. 2A is a cross-section for a lateral laser cavity, which may be used in, for example, edge emitting lasers. In other embodiments, the laser cavity 210 may be a vertical laser cavity configured in, for example, vertical cavity emitting lasers. The laser cavity 210 may be oriented to provide an optical cavity mode for the semiconductor laser device 200.

Figure 2B:
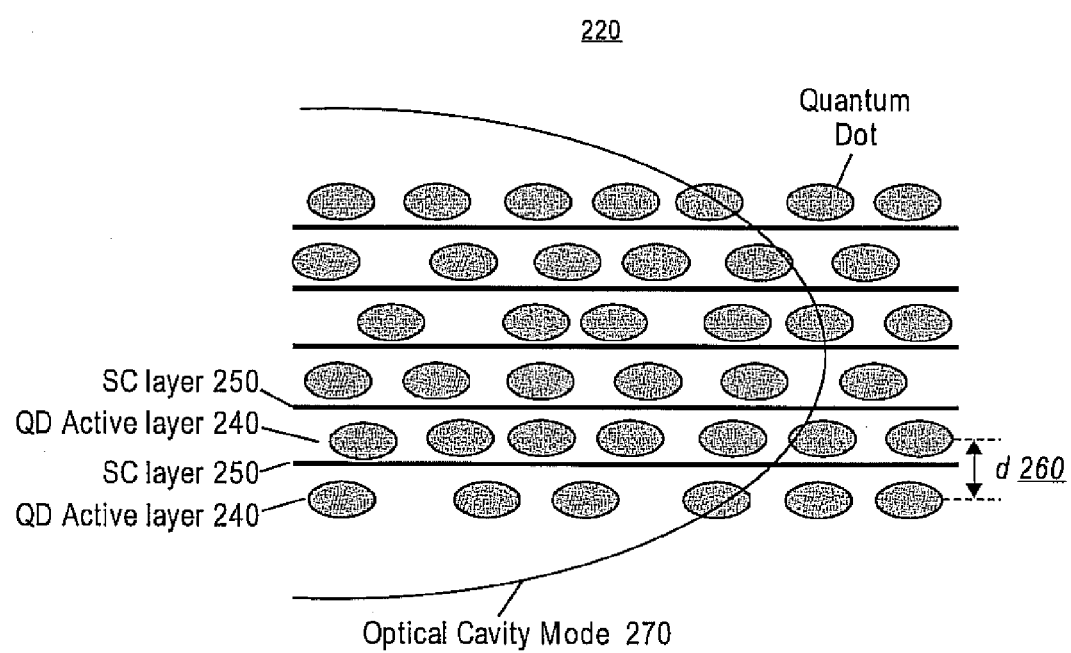
FIG. 2B is a schematic diagram for the QD active structure depicted in FIG. 2A with densely-stacked and strain-compensated QD active layers in accordance with the present teachings.

The exemplary QD active structure 220 described herein may be configured within the laser cavity 210 to provide increased optical modal gain for the semiconductor laser device 200. FIG. 2B shows a schematic diagram of the QD active structure 220. It should be readily obvious to one of ordinary skill in the art that the QD active structure 220 depicted in FIG. 2B represents a generalized schematic illustration and that other or more QDs or layers may be added or existing QDs or layers may be removed or modified.

As shown in FIG. 2B, the QD active structure 220 may include a plurality of QD active layers 240 and a plurality of SC layers 250 stacked in a way that one SC layer may be stacked between two adjacent QD active layers. The distance between the centers of the two adjacent QD active layers may be defined as an interlayer separation d 260. An optical cavity mode 270 provided by the laser cavity 210 may overlap with the QD active layers 240.

In various embodiments, each QD active layer 240 may include a plurality of QDs as shown in FIG. 2B. The plurality of QDs may be non-coalesced (i.e. decoupled). Moreover, the plurality of decoupled QDs may be uniform in size. The average height of the QDs may be about 5-8 nm and the average base diameter may be about 28-32 nm wide. The height of each QD may be equal to or less than its width, and maintain a mean length-to-width ratio in the range of 0.2-0.3.

In various embodiments, each SC layer 250 in FIG. 2B may eliminate the compressive strain of an adjacent QD active layer. Accordingly, the QD active layers 240 may be stacked densely with a sufficient close interlayer separation d 260, for example, where d 260 may be 15 nm or less. Thus, the densely-stacked QD active layers 240 may have a sufficient overlap with the optical cavity mode 270, and thus providing an increased optical modal gain for the semiconductor laser device 200.

In various embodiments, the semiconductor laser device 200 may be any active device, such as, for example, an edge emitting laser, vertical cavity laser, detector, micro-cavity emitter, optical amplifier, or modulator and provide an emission wavelength of 1.3 µm or higher.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A quantum dot active structure for providing modal gain comprising:
   a substrate;
   a plurality of quantum dot active regions stacked over the substrate, each quantum dot active region comprising a quantum dot barrier layer, a quantum dot active layer, and a quantum dot cap layer;
   a plurality of strain-compensation regions, wherein the strain-compensation regions are interspersed with the quantum dot active regions stacked over the substrate; and
   a cap layer formed over the stacked quantum dot active regions.

2. The active structure of claim 1, wherein the substrate comprises an initial substrate and a substrate buffer layer.

3. The active structure of claim 1, wherein the number of the quantum dot active regions stacked over the substrate is about 2 or more.

4. The active structure of claim 1, wherein the strain-compensation regions are interspersed with the quantum dot active regions forming a stack structure,
   wherein the stack structure comprises a plurality of alternating regions of a quantum dot active region and a strain-compensation region.

5. The active structure of claim 1, wherein the quantum dot active layer comprises one or more of InAs, InSb, GaSb, AlSb, AlAs, InGaAs, GaNAs, InGaAsP, and GaInNAs.

6. The active structure of claim 1, wherein each strain-compensation region comprises a strain-compensation layer.

7. The active structure of claim 6, wherein the strain-compensation layer comprises at least one strain-compensation material that reduces the compressive strain of an adjacent quantum dot active region.

8. The active structure of claim 7, wherein the strain-compensation material comprises one or more of GaP, GaNAs, and InGaP.

9. The active structure of claim 6, wherein each strain-compensation region further comprises a strain-compensation barrier layer and a strain-compensation cap layer.

10. A semiconductor laser device comprising:
    a quantum dot active structure comprising,
       a substrate;
       a plurality of quantum dot active layers stacked over the substrate, wherein each quantum dot active layer comprises a plurality of quantum dots;
       a plurality of strain-compensation layers, wherein one or more of the plurality of strain-compensation layers is disposed between any two adjacent stacked quantum dot active layers, and wherein each of the plurality of strain compensation layers further comprises a strain-compensation barrier layer and a strain-compensation cap layer; and
    a laser cavity comprising the quantum dot active structure, wherein the laser cavity is oriented to provide an optical cavity mode for the semiconductor laser device.

11. The device of claim 10, wherein the stacked quantum dot active layers overlap with an optical cavity mode of the laser cavity.

12. The device of claim 10, wherein the stacked quantum dot active layers are decoupled, wherein each decoupled quantum dot active layer comprises a plurality of quantum dots.

13. The device of claim 12, wherein the plurality of quantum dots are uniform in size.

14. The device of claim 10, wherein an interlayer separation between any two adjacent stacked quantum dot active layers is 15 nm or less.

15. The device of claim 10, wherein each stacked quantum dot active layer further comprises a quantum dot barrier layer and a quantum dot cap layer.

16. The device of claim 10 further comprising an emission wavelength of 1.3 µm or higher.

17. The device of claim 10 further comprising an edge emitting laser, vertical cavity laser, detector, micro-cavity emitter, optical amplifier, or modulator.

18. A semiconductor active structure for providing optical modal gain comprising:
    a substrate comprising a GaAs buffer layer overlaying a GaAs initial substrate;
    a plurality of alternating regions of an InAs quantum dot active region which comprises a quantum dot barrier layer and a GaP strain-compensation region formed as a stack structure over the substrate; and
    a GaAs cap layer formed over the stack structure.

19. The semiconductor active structure of claim 18, wherein each InAs quantum dot active region comprises an InAs quantum dot active layer sandwiched between an $In_{(x)}Ga_{(1-x)}As$ barrier layer with a molar fraction, x, less than 1.00 and an $In_{(x)}Ga_{(1-x)}As$ cap layer with a molar fraction, x, less than 1.00.

20. The semiconductor active structure of claim 18, wherein each GaP strain-compensation region comprises a GaP strain-compensation layer sandwiched between a GaAs barrier layer and a GaAs cap layer.

* * * * *